(12) United States Patent
Opolka et al.

(10) Patent No.: US 6,714,392 B2
(45) Date of Patent: Mar. 30, 2004

(54) ELECTRONIC COMPONENT AND UTILIZATION OF A GUARD STRUCTURE CONTAINED THEREIN

(75) Inventors: Heinz Opolka, Regensburg (DE); Paul-Werner Von Basse, Wolfratshausen (DE); Thomas Scheiter, Oberhaching (DE); Rainer Grossmann, München (DE); Christian Peters, München (DE); Reinhard Fischbach, Regensburg (DE); Andreas Gaymann, München (DE); Thomas Rosteck, Otterfing (DE); Domagoj Siprak, Regensburg (DE); Thorsten Sasse, Munich (DE); Reinhard Göllner, Regensburg (DE); Justin Bierner, München (DE); Michael Melzl, Neutraubling (DE); Klaus Hammer, Nittenau/Fischbach (DE); Markus Witte, Regensburg (DE)

(73) Assignee: Infineon Technologies AG, Munich (DE)

( * ) Notice: Subject to any disclaimer, the term of this patent is extended or adjusted under 35 U.S.C. 154(b) by 79 days.

(21) Appl. No.: 09/906,475

(22) Filed: Jul. 16, 2001

(65) Prior Publication Data

US 2002/0066942 A1 Jun. 6, 2002

Related U.S. Application Data

(63) Continuation of application No. PCT/DE00/00112, filed on Jan. 13, 2000.

(30) Foreign Application Priority Data

Jan. 15, 1999 (DE) .......................................... 199 01 384

(51) Int. Cl.$^7$ ................................................. H05F 3/00
(52) U.S. Cl. ......................................... 361/56; 361/112
(58) Field of Search ..................... 361/56, 112; 382/124

(56) References Cited

U.S. PATENT DOCUMENTS

| | | | |
|---|---|---|---|
| 5,325,442 A | | 6/1994 | Knapp |
| 5,656,530 A | * | 8/1997 | Leary .......................... 438/639 |
| 5,726,481 A | | 3/1998 | Moody |
| 5,801,095 A | | 9/1998 | Huang et al. |
| 6,002,569 A | * | 12/1999 | Horvath |
| 6,087,253 A | * | 7/2000 | Liaw ........................... 438/648 |
| 6,114,862 A | * | 9/2000 | Tartagni et al. ............. 324/662 |
| 6,483,931 B2 | * | 11/2002 | Kalnitsky et al. ........... 382/124 |

FOREIGN PATENT DOCUMENTS

| | | |
|---|---|---|
| EP | 0 902 387 A2 | 3/1999 |
| WO | PCT/US98/09292 | 11/1998 |

* cited by examiner

*Primary Examiner*—Brian Sircus
*Assistant Examiner*—Z Kitov
(74) *Attorney, Agent, or Firm*—Laurence A. Greenberg; Werner H. Stemer; Ralph E. Locher

(57) ABSTRACT

An electronic component is described and has a dielectric layer which is constructed on a substrate, conductive surfaces that are constructed on the dielectric layer, and an electrically conductive guard structure. The guard structure is disposed in a plane above the conductive surfaces such that the conductive surfaces are not completely covered by the guard structure.

8 Claims, 6 Drawing Sheets

ELECTRONIC COMPONENT AND UTILIZATION OF A GUARD STRUCTURE CONTAINED THEREIN

CROSS-REFERENCE TO RELATED APPLICATION

This application is a continuation of copending International Application No. PCT/DE00/00112, filed Jan. 13, 2000, which designated the United States.

BACKGROUND OF THE INVENTION

Field of the Invention

The invention relates to an electronic component and the utilization of a guard structure contained in the component to guard against electrostatic discharge. In the past, electronic components have customarily been provided inside a housing, with feeders (contacts) leading out for delivering the energy supply and feeding signals in and/or out. Among these electronic components, those components containing a CMOS semiconductor chip in the housing interior are very sensitive to electrostatic discharge. Potential differences acting on the component from the outside cause charge transfers, which can ultimately lead to an overvoltage at one or more of the gate capacitors, causing a direct discharge between the individual plates of the gate capacitors, which usually destroys the component. This kind of electrostatic charge which destructively discharges can be caused by physical contact; therefore, steps are taken in electronics laboratories to protect against it, for instance by bearing the components on a piece of conductive microcellular rubber. Furthermore, people who come in contact with the components in electronics labs frequently wear corresponding grounding straps, so that contact does not produce a charge. Appropriate precautions are taken for production by use of surface mounting apparatuses, in which the components are mounted on printed circuit boards (PCBs).

If the components are first built into a circuit, there remains a slight danger that the component may be destroyed by electrostatic discharge. But this can occur at any time due to circuit errors or defects of other components. To avoid this, electronic components typically contain additional protective structures to protect against electrostatic discharges (ESD protection) as well as overvoltages that are fed in. They are usually circuits that dissipate overvoltages.

A fundamental disadvantage of such an ESD protection is that it "costs chip space," which contributes nothing to the actual functionality of the electronic component. Another disadvantage of ESD protection is that it frequently changes the functionality of the component. The ESD protection frequently adversely affects the sensitivity and/or dynamic of the component. New electronic components today do not contain a closed housing, so that parts of the semiconductor chips are exposed to the outside. The new electronic components include what are known as chip sizes packages (CSP), in which the chip is assembled with its contacts directly on a printed circuit board. Furthermore, various sensors are also increasingly being produced as semiconductors. Both in CSP and when used as a sensor, the component as a whole, or at least a proportionally relatively large area, is freely accessible to the environment.

These instances reinforce the need for protective measures against electrostatic discharge. Such components also include fingerprint sensors, which contain a matrix of several individual capacitors. It is provided that the finger from which a print is to be taken touches the component directly. Particularly in such a case, a static charge can easily occur, since in the normal use of such a sensor it is unacceptable if the finger has to be grounded for discharging purposes prior to use. Also in mobile devices in which a fingerprint sensor is provided, the danger remains that the carrying of the device may give rise to an electrostatic charge.

International Patent Disclosure WO 98/52157 teaches a fingerprint sensor in which an electrically conductive layer is disposed beneath a ground plate.

Published, European Patent Application EP 09 02 387 A2 teaches the disposing of a grounded strip-shaped conductive layer longitudinally in the interspaces between conductive plates with the intended purpose of guarding against electrostatic discharges.

SUMMARY OF THE INVENTION

It is accordingly an object of the invention to provide an electronic component and the utilization of a guard structure contained therein which overcomes the above-mentioned disadvantages of the prior art devices and methods of this general type, in which reliable ESD protection is provided even when a substantial part is not surrounded by a housing.

With the foregoing and other objects in view there is provided, in accordance with the invention, an electronic component. The electronic component contains a substrate, a dielectric layer disposed above the substrate, conductive surfaces disposed on the dielectric layer, and an electrically conductive guard structure disposed in a plane above the conductive surfaces such that the conductive surfaces are not completely covered by the guard structure. The guard structure is disposed along an interspace region between the conductive surfaces, the guard structure extends in a manner of a strip oblique to a direction in which the interspace region extends.

Providing an electrically conductive guard structure which is disposed in a plane above conductive surfaces and which leaves the conductive surfaces exposed guarantees that the conductive guard structure has the effect of a Faraday cage, given suitable connecting thereof. This is an easy way to guarantee protection against electrostatic discharge.

By virtue of the provided interspace region, the conductive surfaces are not covered by the guard structure. The strip-shaped, angled construction of the guard structure results in non-planar ends which are directed toward the interspace regions and which have the effect of a lightning conductor. The utilization of tungsten to produce the guard structure gives it a high durability.

The guard layer is particularly easy to handle if it is constructed with a width of from 1 to 5 um. Furthermore, the construction of a grate-type guard layer unites easy producibility with high effectiveness as an ESD protection, given minimal material requirements.

In accordance with an added feature of the invention, in a margin of the interspace region, the guard structure changes its direction of progress so as not to exit the interspace region.

In accordance with an additional feature of the invention, the guard structure is constructed from tungsten.

In accordance with another feature of the invention, the guard structure is constructed as a lattice shaped structure.

In accordance with a further feature of the invention, the conductive surfaces form part of an individual sensor element.

In accordance with another added feature of the invention, in a margin of the interspace region, the guard structure changes.

With the foregoing and other objects in view there is provided, in accordance with the invention, a combination of an electronic component having a substrate, a dielectric layer disposed above the substrate and conductive surfaces disposed on the dielectric layer, with a guard device for the electronic component. The guard device contains an electrically conductive guard structure disposed in a plane above the conductive surfaces such that the conductive surfaces are not completely covered by the guard structure. The guard structure is disposed along an interspace region between the conductive surfaces. The guard structure extends in a manner of a strip oblique to a direction in which the interspace region extends, and the guard structure guards against electrostatic discharge.

Other features which are considered as characteristic for the invention are set forth in the appended claims.

Although the invention is illustrated and described herein as embodied in an electronic component and utilization of a guard structure contained therein, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
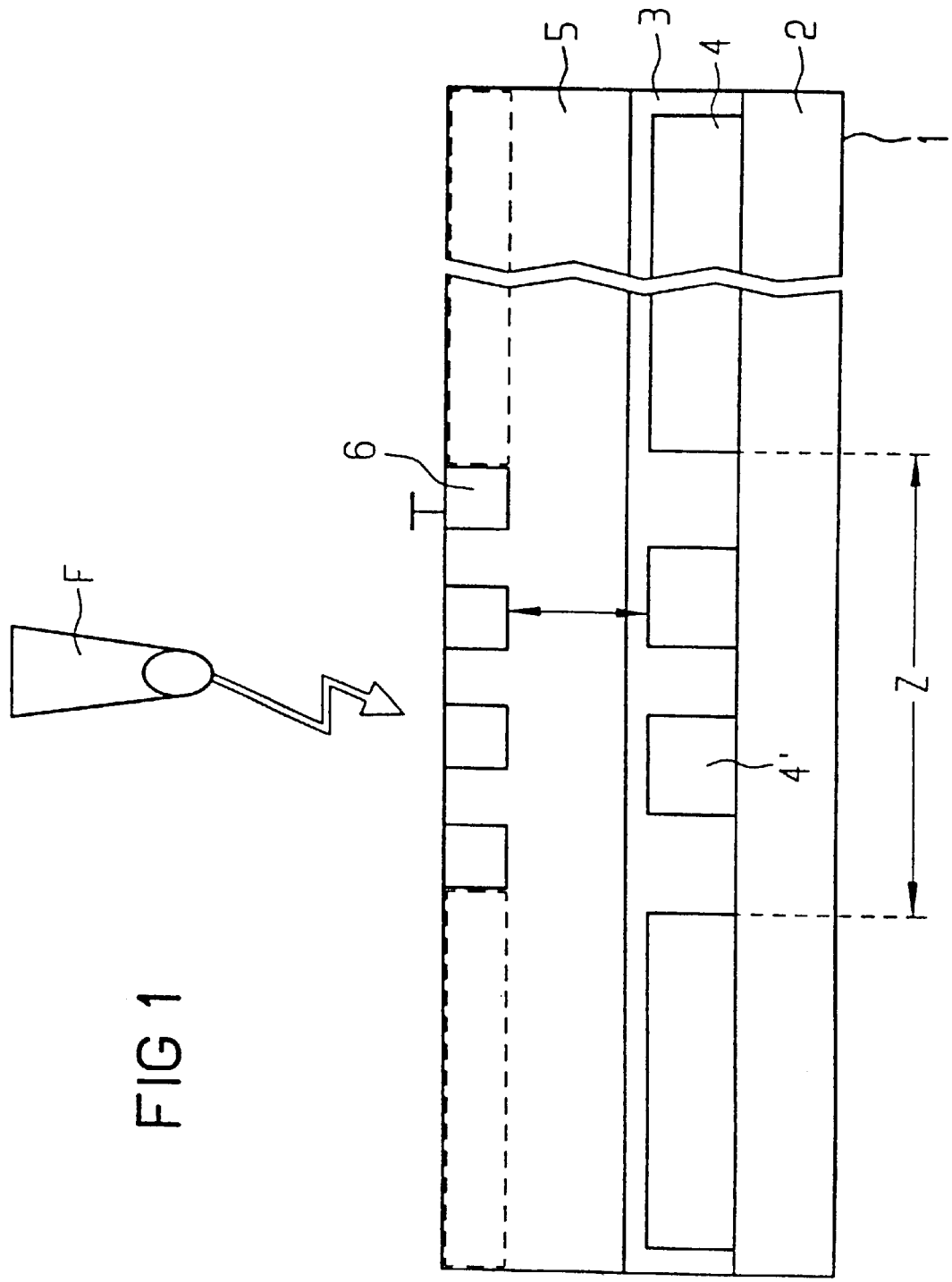
FIG. 1 is a diagrammatic, sectional view of a first exemplifying embodiment of an electronic component according to the invention.

In all the figures of the drawing, sub-features and integral parts that correspond to one another bear the same reference symbol in each case. Referring now to the figures of the drawing in detail and first, particularly, to FIG. 1 thereof, there is shown a schematic diagram of an inventive electronic component. On a surface 1 of a semiconductor chip, a dielectric layer 2 is provided for separating active, i.e. conductive, structures from contact surfaces, i.e. from conductive surfaces disposed over these. In the present exemplifying embodiment, one such conductive surface 4 and 4' is constructed directly on the dielectric layer 2, with interspaces between the electrically conductive surfaces 4 and 4' being filled with an oxide 3, which separates the electrically conductive surfaces 4 and 4' from the overlying nitride layer 5 as well.

In the present exemplifying embodiment, the electrically conductive surfaces 4 are intended as individual sensor elements of a fingerprint sensor. Each of the electrically conductive surfaces 4 thus represents a capacitor surface, whereas the finger as such forms the opposing capacitor surface. The electrically conductive surfaces 4' are lines, the terminals of which are not included in the figures. The nitride layer 5, which can also be composed of several layers, is constructed on the oxide 3. Recesses are provided in the nitride layer 5, which are filled with tungsten. The configuration is constructed so that a finger F from which a print is to be scanned, which must be placed on the surface of this structure, still forms a capacitor with the electrically conductive surfaces 4, because the tungsten structure 6 is disposed in interspaces Z between the electrically conductive surfaces 4. If the finger F is electrically charged, it is discharged if the tungsten structure 6 is grounded as indicated in FIG. 1.

In the present exemplifying embodiment, the fingerprint sensor contains a suitable structure in which the oxide 3 surrounding the conductive surfaces 4 is approximately 250 nm thick, the nitride is 1500 nm thick, and the recesses for the tungsten structure 6 are approximately 370 to 700 nm deep and approx. 1 um wide.

Figure 2:
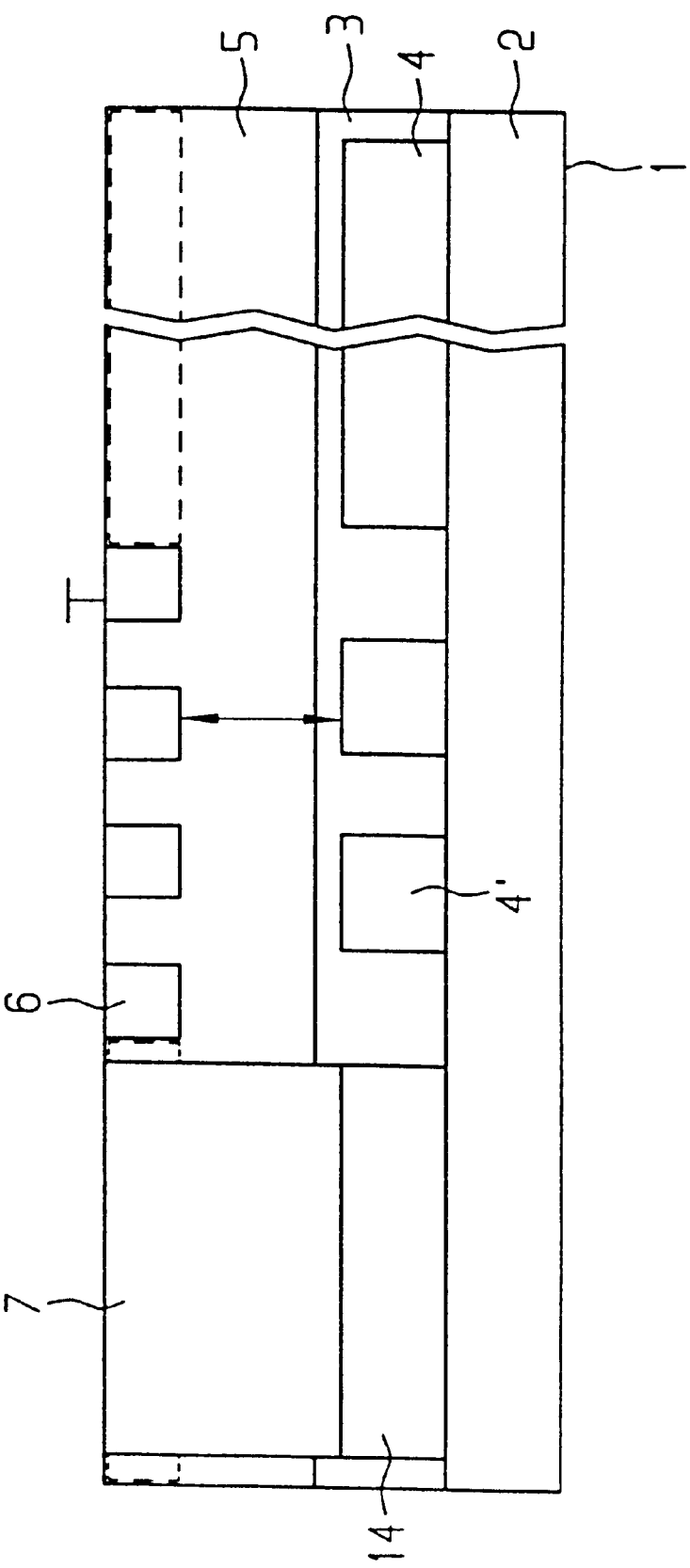
FIG. 2 is a sectional view of a second exemplifying embodiment of the electronic componet.

FIG. 2 represents the utilization of the tungsten structure 6 in an electronic component for surface mounting as in CSP. Here, a conductive surface 14 that is constructed in the oxide 3 is exposed through the protective nitride 5 all the way to the top surface. An opening 7 that is so formed serves for bonding the conductive surfaces 14, which serve as the contact pad in the surface mounting onto a PCB. The opening 7 is then filled with a solder or a solder glue. The tungsten structure 6 is again provided at the top surface, which will not be approached by a charged finger during ordinary use in a mounted condition, though during the normal operation of a component that is mounted as a CSP it may easily happen that an electrostatic charge occurs on the surface of the PCB. Here, as well, the conductive guard structure 6, which is also constructed as the tungsten structure 6 in this exemplifying embodiment, serves to guard against electrostatic discharge if it is grounded. It acts as a Faraday cage for the component, so to speak. Though the use of tungsten is not strictly prescribed, its maximum current density is higher than that of other AL alloys used in semiconductor technology today by a factor of 6, and its melting point, at 3410° C., stands substantially above that of common aluminum alloys (AlSiCu/660° C.).

Both in FIG. 1 and in FIG. 2, the tungsten structure 6 is constructed above the conductive surfaces 4', which are situated in the same plane as the conductive surfaces 4. This is so selected because the conductive surfaces 4' need not be accessible from the outside.

Figure 3:
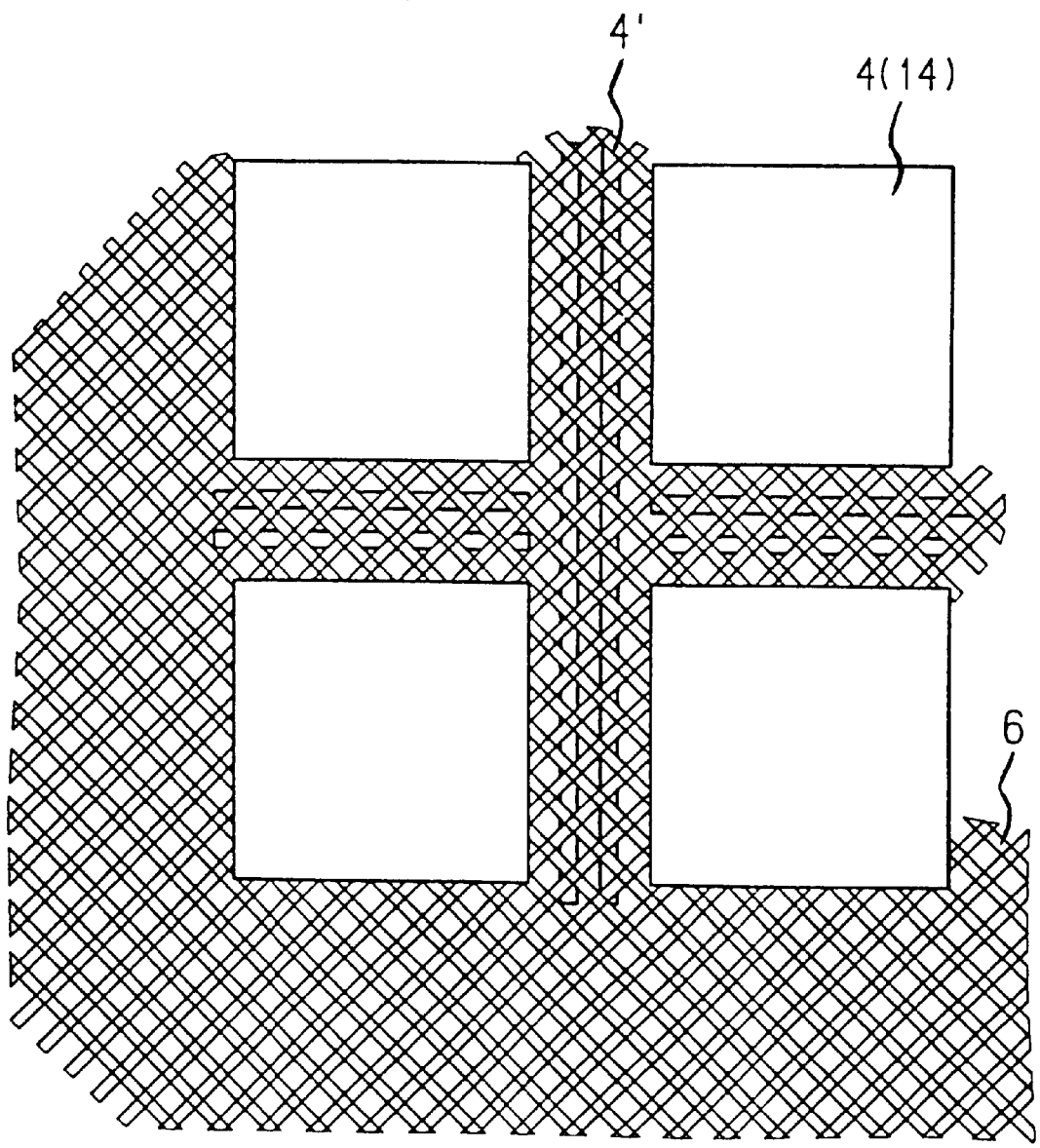
FIG. 3 is a plan view of the exemplifying embodiments shown in FIG. 1 and FIG. 2.

This is represented again in FIG. 3 from above. The conductive surfaces 4 and 14 are represented. Cover layers are omitted in this representation. That is, the conductive surfaces 4 are recognizable as the contact surfaces 14, as described in association with FIG. 2, and as the capacitor plate 4, as described in association with FIG. 1. Between the conductive surfaces 4 and 14, the conductive tungsten structure 6 is constructed, which has the shape of a grating (lattice shape) as viewed from above and which is aligned oblique to the side surfaces of the conductive surfaces 4 and 14. By virtue of the grate shape and the fact that the grate does not cover the conductive surfaces 4 and 14, projections and peaks develop in the structure at the margins, which are particularly suitable for guarding against electrostatic discharge. The grate structure thus has a similar effect to a lightning conductor at the margins in the direction of the conductive surfaces 4. The conductive surfaces 4' are represented between the conductive surfaces 4 and 14, as already represented in FIGS. 1 and 2, which are covered by the tungsten grate 6, since the conductive surfaces 4' need not be accessible from above.

Figure 4:
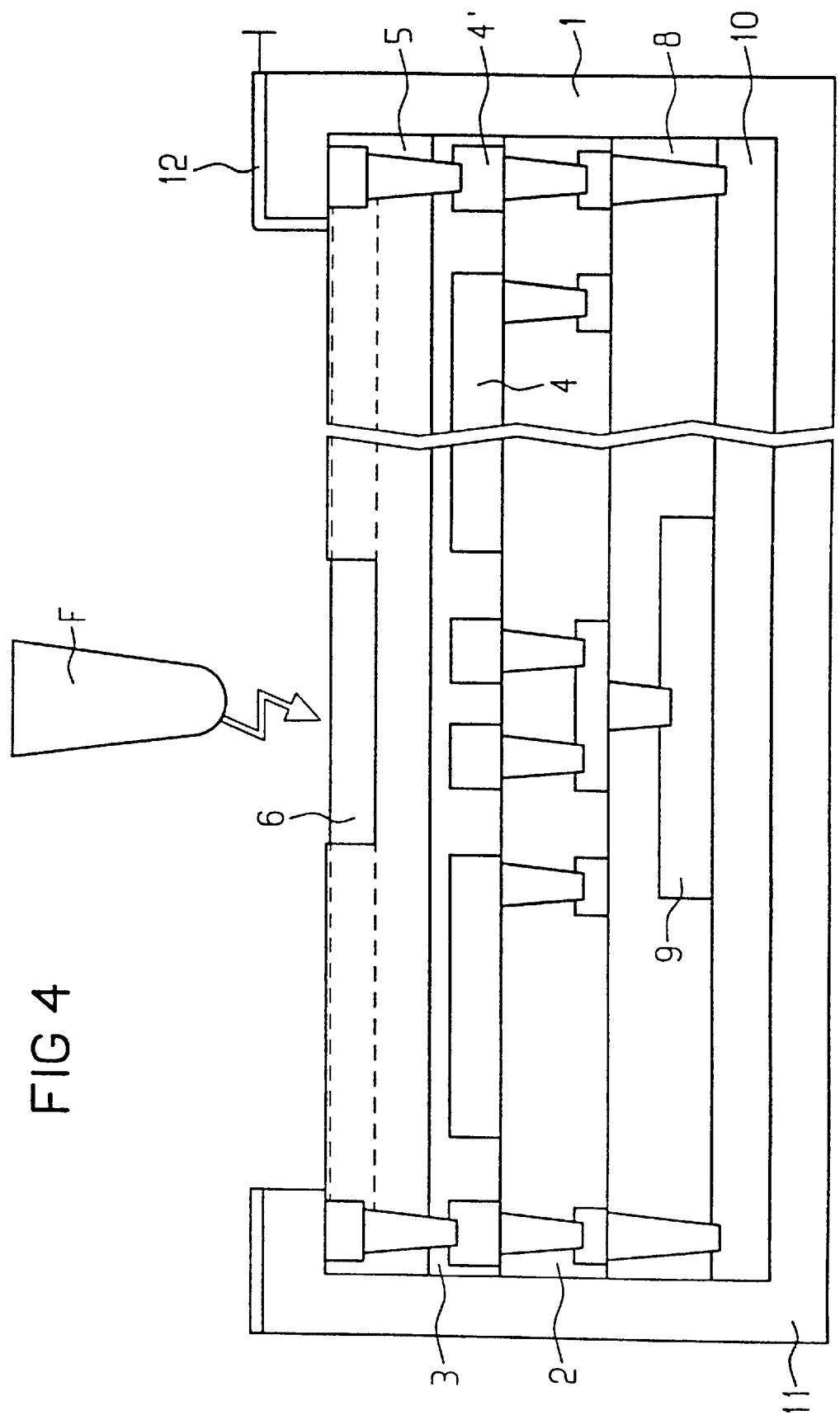
FIG. 4 is a sectional view of an advantageous development of the exemplifying embodiment represented in FIG. 1.
Figure 5A:
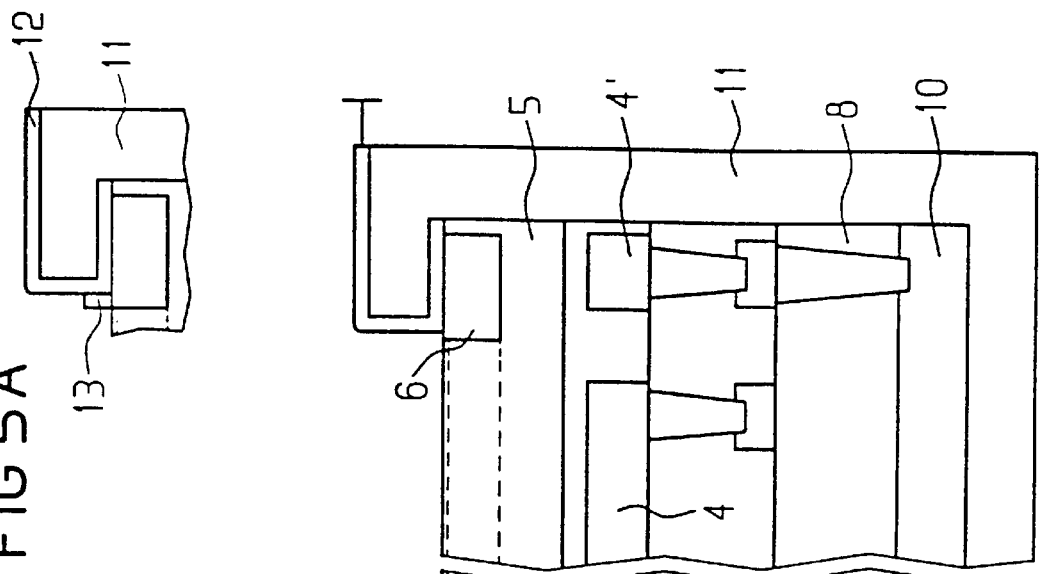
FIG. 5a is a sectional view showing a ground frame connection.
Figure 5:
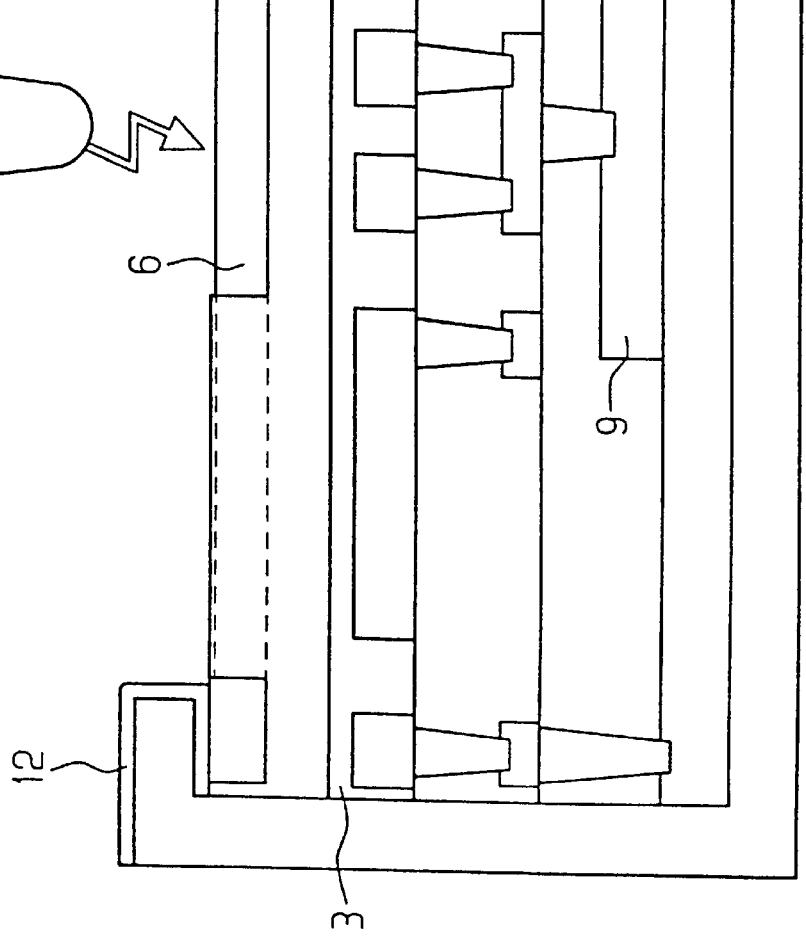
FIG. 5 is a sectional view of an additional advantageous development of the exemplifying embodiment represented in FIG. 1.

With reference to FIG. 4 and FIG. 5, an advantageous development of the invention as a fingerprint sensor is represented. Identical elements are provided with identical reference characters. The fingerprint sensor, which is represented in section, contains a substrate 10 at whose top surface an active structure in the form of an integrated circuit can be constructed, though this need not necessarily be provided for purposes of the present invention. Over this, on part of a substrate surface, a structure made of polysilicon 9 is located, this being covered by a boron-phosphorus-silicon oxide glass layer 8 in turn. Over this, a first metallization layer having metallization tracks (which are not described in detail) is located, which is covered by a dielectric layer 2. The dielectric layer 2 is the same layer that is already known from the representations according to FIG. 1 and FIG. 2. The overlying structure also corresponds to the structure as represented in FIG. 1 and FIG. 2. The overall component is surrounded by a housing 11, which leaves one top surface of the component exposed but wraps around at the margin so as to make contact with the top surface.

According to FIG. 4, through-contacts are provided through all the abovementioned layers from the top surface down to the substrate, which is connected to ground. In turn, the part of the through-contact at the surface is electrically connected to the tungsten structure 6. A configuration corresponding to a Faraday cage is provided by this structure. The frame, which surrounds the exposed chip surface, of the housing 11 is provided with a ground frame 12.

By contrast, in FIG. 5 there are no through-contacts through all the layers. In the exemplifying embodiment represented here, the tungsten structure 6 is electrically conductively connected to the ground frame 12. Otherwise, the underlying structures are again interconnected by through-contacting in the margin region, and the ground connection is achieved via the substrate 10. A Faraday cage is provided in this exemplifying embodiment as well.

In a variant of the exemplifying embodiment represented in FIG. 5, the connection between the ground frame 12 and the tungsten structure 6 can also be generated by a conductive glue. To accomplish this, the ground frame 12 need not wrap around so far that it makes contact with the tungsten structure 6 as represented in FIG. 5. It suffices to connect the configuration of the ground frame 12 to the tungsten structure 6 where it approaches (see FIG. 5a) using a conductive glue connection 13, similarly to the representation in FIG. 4.

Figure 6:
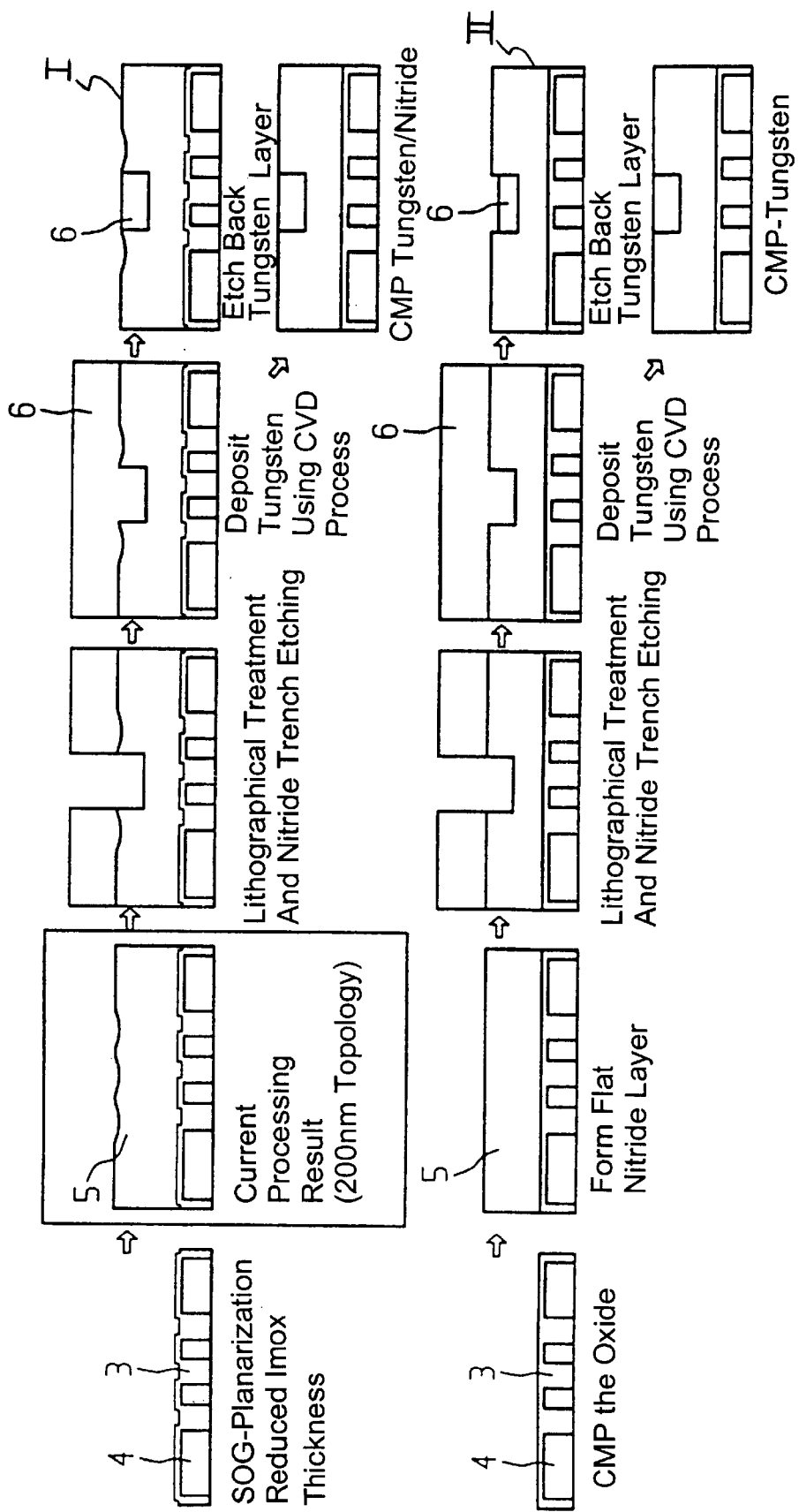
FIG. 6 is a block diagram showing production steps in the production of the electronic component.

FIG. 6 is a schematic representation of the production of the tungsten structure. The structure emerging from the conductive surfaces 4, 14, and 4' and the oxide 3 that surrounds these surfaces is first planarized. The nitride is applied to the structure and lithographically treated, whereupon a nitride trench etching technique is performed for forming the abovementioned recesses. Next, tungsten is deposited by a chemical vapor deposition (CVD) step. The surface-wide tungsten deposit is then eroded to the level of the nitride layer. Whereby the different erosion methods represented in I and II lead to different waviness of the structure. Unlike the top part of FIG. 6, in the bottom part of FIG. 6 the initial structure of the conductive surfaces and the oxide surrounding them is sufficiently flat that a flat nitride layer also forms.

For the tungsten structure, a width of between 1 and 10 um can be provided, depending on the technology utilized. In CSP components which are not subjected to the extreme case of an electrostatically charged finger nearing the surface, it may also be expedient not to form a grate structure, but rather simply to completely cover part of the surface with tungsten.

The above described invention is not limited to semiconductor components only. It is also applicable in equal measure to future technologies such as electronic circuits in polymer switch technology. The invention is particularly advantageous when these components are freely accessible as in the case of sensors, of which fingerprint sensors are only one example. Such an application is already foreseeable for use on chip cards, where resistant and elastic fingerprint sensors that are protected against environmental influences are needed in order to be able to reliably determine the identity of the user.

We claim:

1. An electronic component, comprising:

a substrate;

a dielectric layer disposed above said substrate;

conductive surfaces disposed on said dielectric layer; and an electrically conductive guard structure disposed in a plane above said conductive surfaces and along an interspace region, extending in a given direction, formed between said conductive surfaces, said guard structure defining strips not completely covering said conductive surfaces and extending obliquely in said interspace region relative to said given direction.

2. The electronic component according to claim 1, wherein in a margin of said interspace region, said guard structure changes its direction of progress so as not to exit said interspace region.

3. The electronic component according to claim 1, wherein said guard structure is constructed from tungsten.

4. The electronic component according to claim 1, wherein said guard structure has a width of from 1 to 5 um.

5. The electronic component according to claim 1, wherein said guard structure is constructed as a lattice shaped structure.

6. The electronic component according to claim 1, wherein said conductive surfaces form part of an individual sensor element.

7. The electronic component according to claim 1, wherein in a margin of said interspace region, said guard structure changes.

8. In combination with an electronic component having a substrate, a dielectric layer disposed above the substrate and conductive surfaces disposed on the dielectric layer, a guard device for the electronic component, the guard device comprising:

an electrically conductive guard structure disposed along an interspace region between the conductive surfaces and in a plane above the conductive surfaces such that the conductive surfaces are not completely covered by said guard structure, said guard structure defining strips extending obliquely in said interspace region relative to a direction in which said interspace region extends, said guard structure guarding against electrostatic discharge.

\* \* \* \* \*